United States Patent
Chung

(10) Patent No.: US 8,030,739 B2
(45) Date of Patent: Oct. 4, 2011

(54) SEMICONDUCTOR PACKAGE HAVING CHIP SELECTION THROUGH ELECTRODES AND STACKED SEMICONDUCTOR PACKAGE HAVING THE SAME

(75) Inventor: Qwan Ho Chung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 420 days.

(21) Appl. No.: 12/260,172

(22) Filed: Oct. 29, 2008

(65) Prior Publication Data

US 2009/0267208 A1    Oct. 29, 2009

(30) Foreign Application Priority Data

Apr. 25, 2008   (KR) .................. 10-2008-0038839

(51) Int. Cl.
  *H01L 29/40* (2006.01)
  *H01L 21/44* (2006.01)
(52) U.S. Cl. ....................... 257/621; 438/667
(58) Field of Classification Search .......... 257/621, 257/776–778; 438/667, 672
See application file for complete search history.

(56) References Cited

U.S. PATENT DOCUMENTS 7,129,567 B2 * 10/2006 Kirby et al. .................. 257/621
7,355,267 B2    4/2008 Kirby et al.

FOREIGN PATENT DOCUMENTS

JP    2008-021834 A    1/2008
KR    10-0364635 B1    12/2002

* cited by examiner

*Primary Examiner* — Calvin Lee
(74) *Attorney, Agent, or Firm* — Ladas & Parry LLP

(57) ABSTRACT

A stacked semiconductor package includes a plurality of stacked semiconductor chips each having a circuit unit, a data pad, and a chip selection pad. The plurality of stacked semiconductor chips also includes a plurality of chip selection through electrodes. The chip selection through electrodes penetrate the chip selection pads and the semiconductor chips, and the chip selection through electrodes receive chip selection signals. The chip selection pad of a semiconductor chip is electrically connected to the chip selection through electrode that receives the chip selection signal for selecting the semiconductor chip. The chip selection pad is electrically insulated from the chip selection through electrodes for receiving the chip selection signal for selecting a different semiconductor chip.

20 Claims, 7 Drawing Sheets

SEMICONDUCTOR PACKAGE HAVING CHIP SELECTION THROUGH ELECTRODES AND STACKED SEMICONDUCTOR PACKAGE HAVING THE SAME

CROSS-REFERENCE TO RELATED APPLICATIONS

The present application claims priority to Korean patent application number 10-2008-0038839 filed on Apr. 25, 2008, which is incorporated herein by reference in its entirety.

BACKGROUND OF THE INVENTION

The present invention relates generally to a semiconductor package and a stacked semiconductor package having the same, and more particularly to a semiconductor package having chip selection through electrodes for selecting a semiconductor chip and a stacked package having the same.

Recent developments in semiconductor chip technology have lead to semiconductor chips capable of storing massive amounts of data and processing the massive amounts of data within a short time, and semiconductor packages having a plurality of the semiconductor chips.

In stacked semiconductor package technology, at least two semiconductor chips are stacked in order to enhance data storage capacity and data processing speed.

The stacked semiconductor package requires a structure adapted to select one of the stacked semiconductor chips for inputting or outputting data. In conventional stacked semiconductor packages, each semiconductor chip is formed with a different chip selection pattern making it possible to select the respective semiconductor chips.

However, this method of selecting stacked semiconductor chips requires that different pattern masks be used for the different chip selection patterns of the semiconductor chips. Having to utilize different masks to form the different chip selection patterns greatly increases the complexity of the fabrication process of the stacked semiconductor package, and increases the amount of time taken to fabricate the stacked semiconductor package.

SUMMARY OF THE INVENTION

Embodiments of the present invention are directed to a semiconductor package having a configuration allowing for a fabrication process that does not require the utilization of different masks to form different chip selection patterns and that can be completed in a relatively short period of time.

Additionally, embodiments of the present invention are directed to a stacked semiconductor package having the aforementioned semiconductor package.

In one embodiment, a semiconductor package comprises a semiconductor chip including a circuit unit and pads including data pads and a chip selection pad electrically each connected with the circuit unit; and at least two chip selection through electrodes penetrating the chip selection pad and the semiconductor chip and having one through electrode electrically connected to the chip selection pad and second through electrodes electrically connected to the chip selection pad.

The chip selection pad includes a conductive layer and the conductive layer may include openings for insulating the second through electrodes.

The first through electrode and the second through electrode are disposed in a form of a matrix.

The number of the chip selection pads may be more than one.

The area of the chip selection pad is greater than the area of the data pad.

In another embodiment, a stacked semiconductor package comprises a plurality of semiconductor chips stacked over each other and each having a circuit unit, a data pad and a chip selection pad; and chip selection through electrodes penetrating the chip selection pads and the semiconductor chips corresponding to the chip selection pads, wherein the respective chip selection through electrodes are electrically connected to the chip selection pad of different semiconductor chips.

The respective chip selection pads of the semiconductor chips include a conductive layer, and the respective chip selection through electrodes are electrically connected to the conductive layer of the chip selection pad of different semiconductor chips.

The portions of the conductive layer corresponding to the chip selection through electrodes that are not electrically connected to the chip selection pad may include an opening for insulating the chip selection through electrode.

Alternatively, the portions of the conductive layer corresponding to the chip selection through electrode that is not electrically connected to the chip selection pad may include an insulation member for insulating the chip selection through electrode.

The number of the chip selection pads may be more than one.

The chip selection through electrodes are disposed in a form of a matrix.

The chip selection through electrodes are disposed within through holes penetrating the chip selection pads of the semiconductor chips.

The number of the chip selection through electrodes may be equal to or greater than the number of the stacked semiconductor chips.

The area of the chip selection pad is greater than the area of the data pad.

DESCRIPTION OF SPECIFIC EMBODIMENTS

Figure 1:
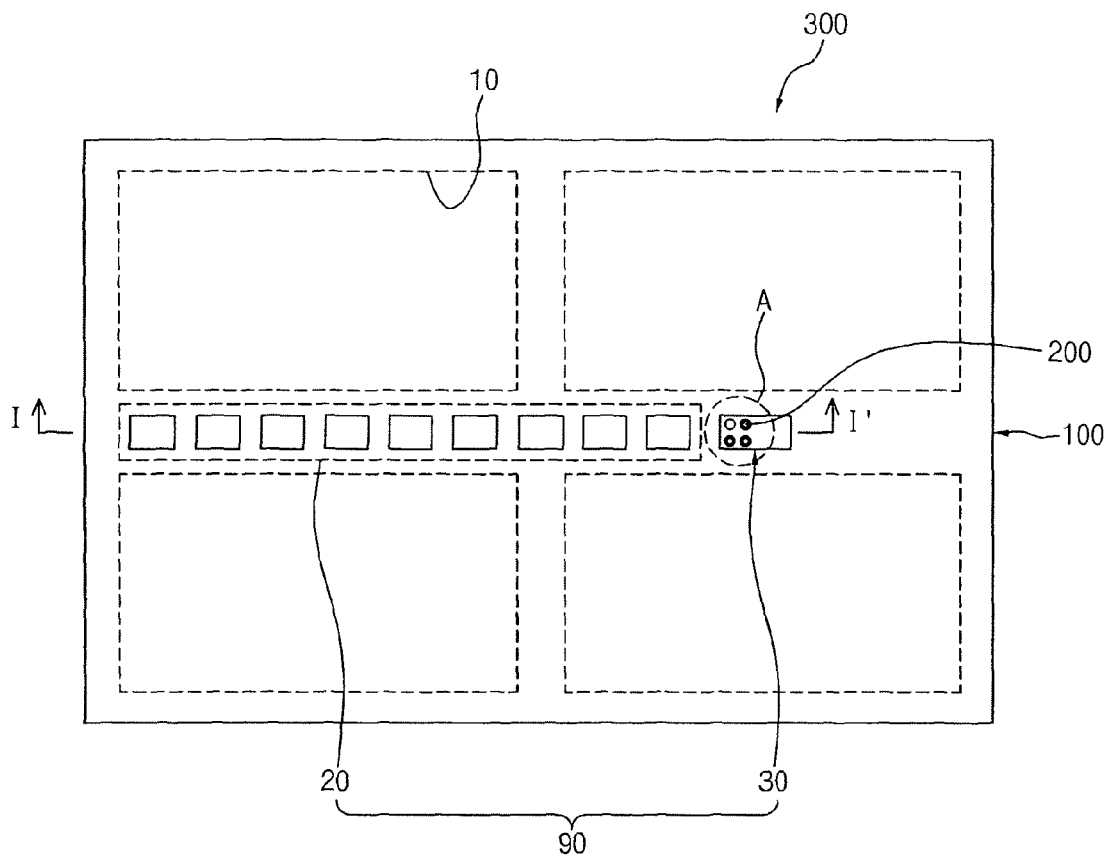
FIG. 1 is a plan view showing a semiconductor package according to an embodiment of the present invention.
Figure 2:
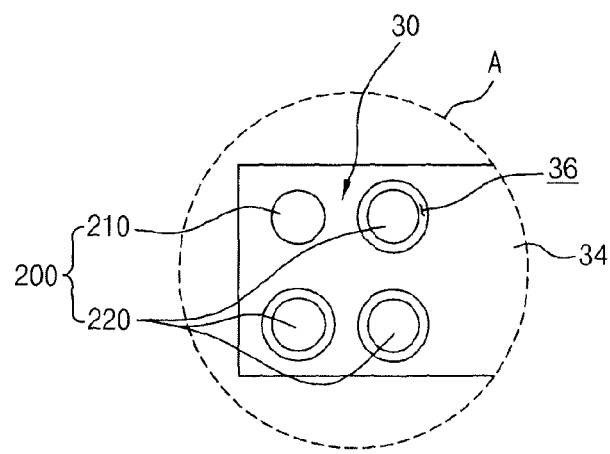
FIG. 2 is an enlarged view of portion 'A' in FIG. 1.
Figure 3:
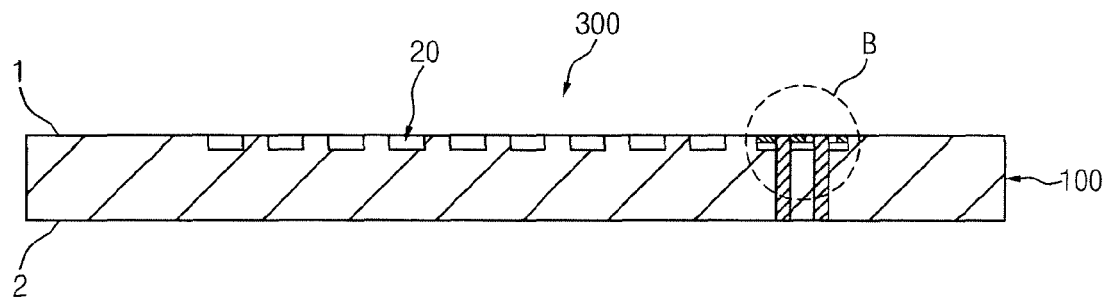
FIG. 3 is a cross-sectional view taken along line I-I' in FIG. 1.
Figure 4:
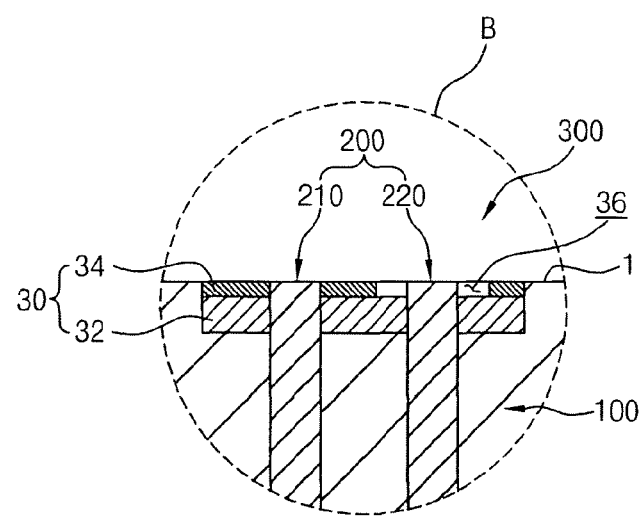
FIG. 4 is an enlarged view of portion 'B' in FIG. 3.

FIG. 1 is a plan view showing a semiconductor package according to an embodiment of the present invention. FIG. 2 is an enlarged view of portion 'A' in FIG. 1. FIG. 3 is a cross-sectional view taken along line I-I' in FIG. 1. FIG. 4 is an enlarged view of portion 'B' in FIG. 3.

Referring to FIGS. 1 through 4, a semiconductor package 300 includes a semiconductor chip 100 and chip selection through electrodes 200.

The semiconductor chip 100 may have, for example, a rectangular parallelepiped shape. The semiconductor chip 100 includes an upper face 1 and a lower face 2 that is opposite the upper face 1 as shown in FIG. 3.

The semiconductor chip includes a circuit unit 10 and pads 90.

The circuit unit 10 includes a data storing unit (not shown) for storing data and/or a data processing unit (not shown) for processing the data. In one example of an embodiment of the present invention, four circuit units 10 are disposed in the semiconductor chip 100 in the form of a 2×2 matrix.

The pads 90 may be, for example, disposed between the circuit units 10 (which are disposed in the form of a 2×2 matrix).

The pads 90 include data pads 20 and a chip selection pad 30.

Respective data pads 20 are electrically connected to respective circuit units 10. The data pads 20 input data received from the outside to the circuit unit 10 or output data from the circuit unit 10 to the outside.

The chip selection pad 30 is electrically connected to the circuit unit 10. In embodiments of the present invention, when a plurality of semiconductor chips 100 are stacked, the chip selection pad 30 receives a chip selection signal for selecting a designated semiconductor chip 100 and inputs the chip selection signal to the circuit unit 10. In the present invention, for example, at least one chip selection pad 30 is disposed over the upper face 1 of the semiconductor chip 10. FIG. 1 shows an exemplary embodiment, it is noted that, for example, two chip selection pads 30 may also be disposed over the upper face 1 of the semiconductor chip 100.

Referring to FIG. 4, the chip selection pad 30 includes a chip selection pad body 32 and a conductive layer 34. The chip selection pad body 32 includes, for example, an insulator; and the conductive layer 34 includes a metal such as aluminum or an aluminum alloy. In the present embodiment, the conductive layer 34 is electrically connected to the circuit unit 10.

In the embodiment of the present invention shown in FIG. 4, a plurality of chip selection through electrodes 200 (to be described later) are formed in the chip selection pad 30; and therefore, it is preferable that the chip selection pad 30 have a size greater than the size of a data pad 20.

Each of the chip selection through electrodes 200 penetrates the chip selection pad 30 and portions of the upper and lower faces of the semiconductor chip 100 corresponding to the chip selection pad 30.

In an embodiment of the present embodiment, the chip selection through electrodes 200 may include copper having superior electrical properties.

In an embodiment of the present invention, the semiconductor package 300 includes at least two chip selection through electrodes 200. In the embodiment of the present invention shown in FIGS. 1-4, the semiconductor package 300 includes four chip selection through electrodes 200.

In the embodiment of the present invention shown in FIGS. 1-4, the four chip selection through electrodes 200 are disposed in the form of a 2×2 matrix.

Hereinafter, the four chip selection through electrodes 200 will be divided into a first through electrode 210 and second through electrodes 220. In the present embodiment shown in FIGS. 1-4, there is one first through electrode 210 and three second through electrodes 220.

Referring to FIG. 4, the first through electrode 210 of the chip selection through electrodes 200 is electrically connected to the conductive layer 34 of the chip selection pad 30. Therefore, when a chip selection signal is applied to the first through electrode 210, the chip selection signal is applied to the circuit unit 10 through the first through electrode 210 and the conductive layer 34.

The three second through electrodes 220 of the chip selection through electrodes 200 are not electrically connected to the conductive layer 34 of the chip selection pad 30. Therefore, when a chip selection signal is applied to the second through electrodes, the chip selection signal is not applied to the circuit unit 10.

In order to electrically insulate the three second through electrodes 220 from the conductive layer 34 of the chip selection pad 30, openings 36 corresponding to the second through electrodes 220 are formed in the conductive layer 34.

The respective openings 36 electrically insulate the second through electrodes 220 from the conductive layer 34.

Figure 5:
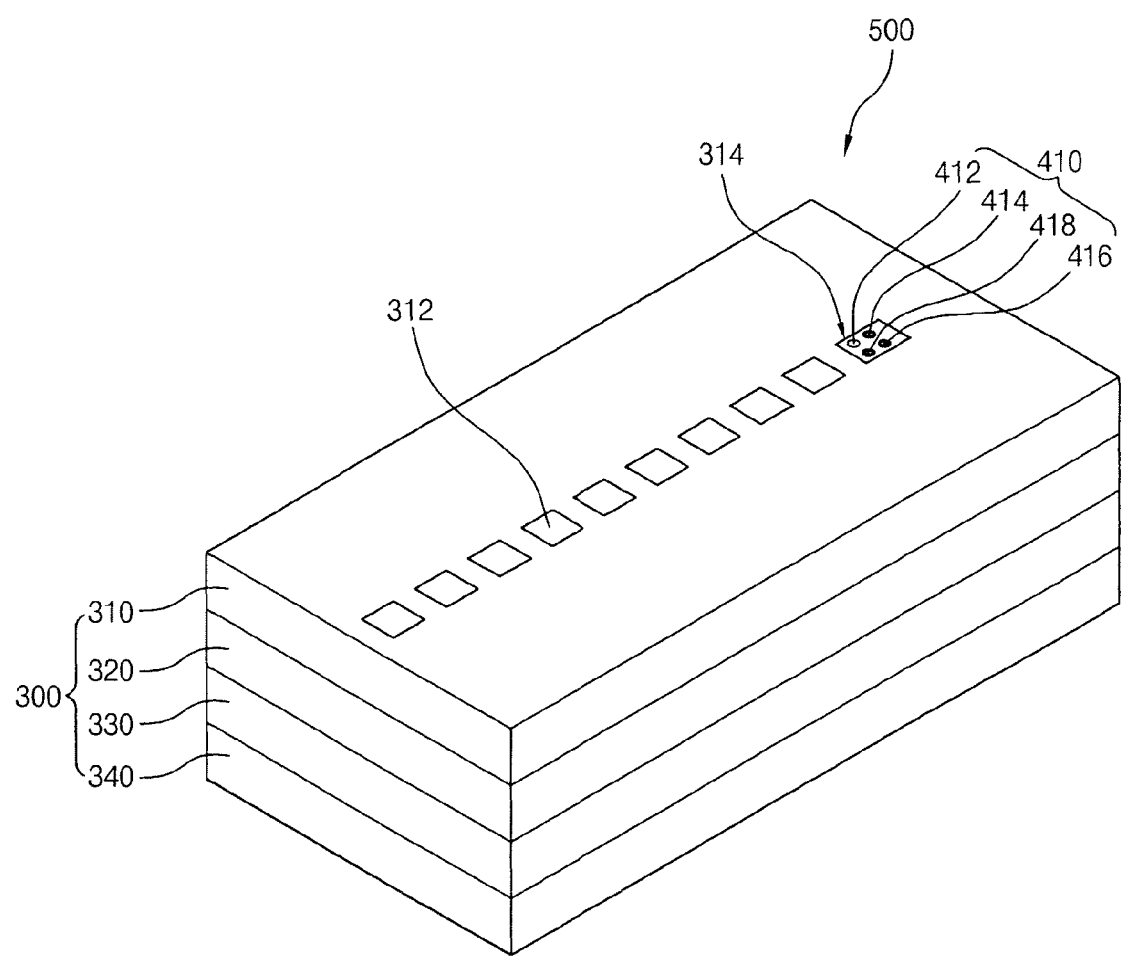
FIG. 5 is a cross-sectional view showing a stacked semiconductor package according to an embodiment of the present invention.

FIG. 5 is a cross-sectional view showing a stacked semiconductor package according to an embodiment of the present invention.

Referring to FIG. 5, a stacked semiconductor package 500 includes a plurality of semiconductor chips 300 and a plurality of chip selection through electrodes 410.

In the present embodiment shown in FIG. 4, the semiconductor package 500 includes a first semiconductor chip 310, a second semiconductor chip 320, a third semiconductor chip 330, and a fourth semiconductor chip 340. However, the present invention is not limited to four semiconductor chips, and any number of semiconductor chips may be stacked.

The semiconductor package 500 includes four chip selection through electrodes 400, including a first chip selection through electrode 410 formed in the first semiconductor chip 310, a second chip selection through electrode 420 formed in the second semiconductor chip 320, a third chip selection through electrode 430 formed in the third semiconductor chip 330, and a fourth chip selection through electrode 440 formed in the fourth semiconductor chip 340.

FIGS. 6 through 9 are plan views of the first through fourth semiconductor chips included in the stacked semiconductor package 500 shown in FIG. 5.

Figure 6:
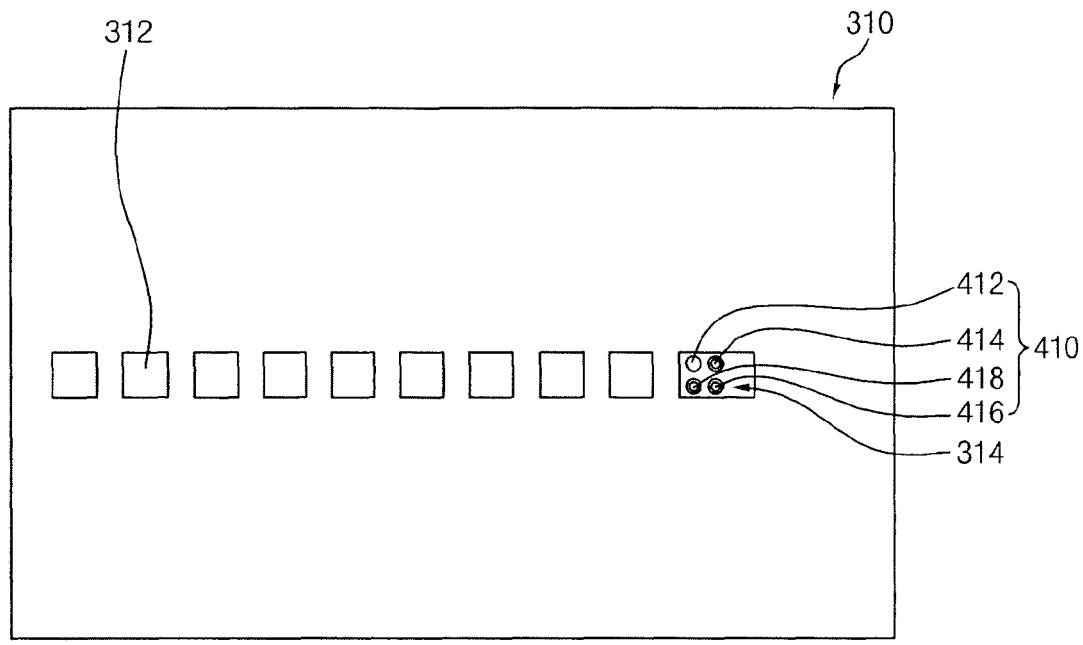
FIGS. 6 through 9 are plan views of the first through fourth semiconductor chips included in the stacked semiconductor package shown in FIG. 5.

Referring to FIG. 6, the first semiconductor chip 310 includes a circuit unit (not shown), first data pads 312, and a first chip selection pad 314.

The first data pads 312 and the first chip selection pad 314 are each electrically connected to the circuit unit.

In the present embodiment shown in FIG. 6, the first chip selection pad 314 includes a first chip selection pad body (not shown, refer to FIG. 4) and a conductive layer formed over the first chip selection pad body. The conductive layer includes a metal such as aluminum or an aluminum alloy.

In an embodiment of the present invention, more than one first chip selection pads 314 may be disposed over an upper face of the first semiconductor chip 310. The size of the first chip selection pad 314 is, for example, greater than the size of the first data pad 312.

The first chip selection through electrodes 410 are disposed at a position corresponding to the first chip selection pad 314. The first chip selection through electrodes 410 penetrate the first chip selection pad 314, the upper face of the first semiconductor chip 310 corresponding to the first chip selection pad 314, and a lower face of the first semiconductor chip 310 opposite to the upper face.

In the present embodiment, the number of first chip selection through electrodes 410 is the same as the number of stacked semiconductor chips. Alternatively, the number of first chip selection through electrodes 410 may be more than the number of stacked semiconductor chips.

In FIG. 6, the first chip selection through electrodes 410 can be designated as a first through electrode 412 and second through electrodes 414, 416, 418. The first through electrode 412 and the second through electrodes 414, 416, 418 correspond to the first chip selection pad 314 and are disposed in the form of a 2×2 matrix.

In the present embodiment shown in FIG. 6, the first through electrode 412 has been arbitrarily selected to be disposed at the upper left portion of the first chip selection pad 314 (the first through electrode 412 may also be disposed at the upper right, lower left, or lower right portion of the first chip selection pad 312). The remaining first chip selection through electrodes 410 are the second through electrodes 414, 416, 418 and when the first through electrode 412 is disposed at the upper left portion of the first chip selection pad 313, the second through electrodes are disposed at the upper right, the lower left, and the lower right portions of the first chip selection pad 314.

The first through electrode 412 is electrically connected to the conductive layer of the first chip selection pad 314, and the second through electrodes 414, 416, 418 are electrically insulated from the conductive layer of the first chip selection pad 314. In order to insulate the second through electrodes 414, 416, 418 from the conductive layer, openings corresponding to the second through electrodes 414, 416, 418 are formed in the conductive layer. However, other suitable methods of insulating the second through electrodes 414, 416, 418 exist, including disposing insulation members having a layer form in the portions corresponding to the second through electrodes 414, 416, 418.

Figure 7:
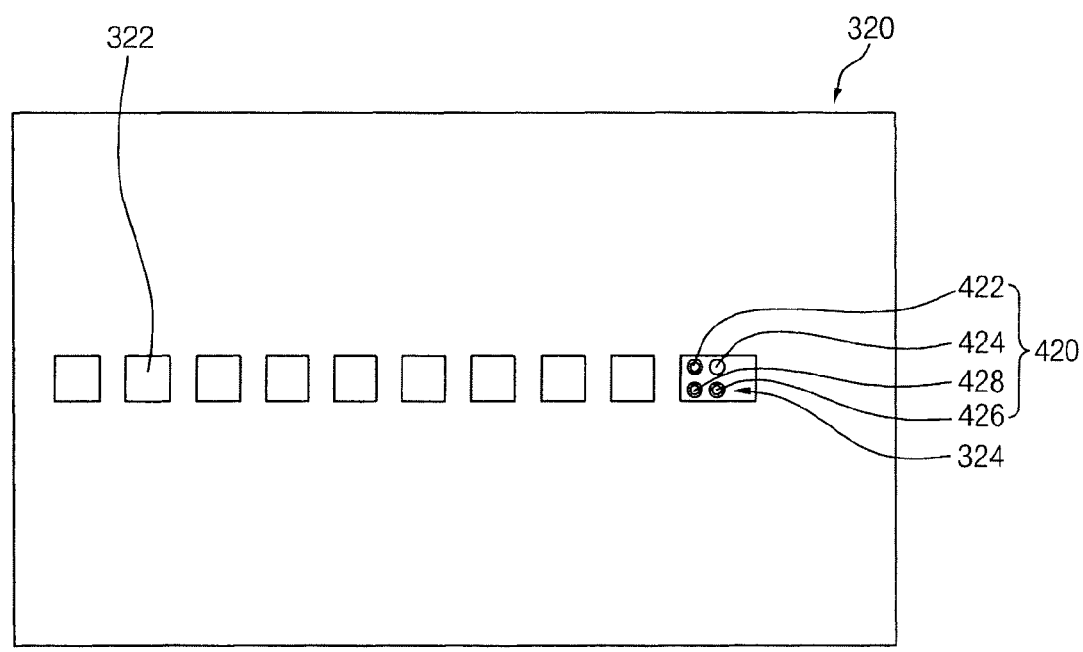

Referring to FIG. 7, the second semiconductor chip 320 is disposed below the first semiconductor chip 310 in the stacked semiconductor package 500.

The second semiconductor chip 320 includes a circuit unit (not shown), second data pads 322, and a second chip selection pad 324.

The second data pads 322 and the second chip selection pad 324 are each electrically connected to the circuit unit.

In the present embodiment, the second chip selection pad 324 includes a second chip selection pad body (not shown, refer to FIG. 4) and a conductive layer formed over the second chip selection pad body. The conductive layer includes a metal such as aluminum or an aluminum alloy.

In an embodiment of the present invention, more than one second chip selection pad 324 may be disposed over the upper face of the second semiconductor chip 320. In the present embodiment, the position of the second chip selection pad 324 is substantially equivalent to (i.e., aligned with) the position of the first chip selection pad 314. In the embodiment of the present invention shown in FIG. 7, the size of the second chip selection pad 324 is greater than the size of the second data pad 322.

The second chip selection through electrodes 420 are disposed at a position corresponding to the second chip selection pad 324. The second chip selection through electrodes 420 penetrate the second chip selection pad 324, the upper face of the second semiconductor chip 320 corresponding to the second chip selection pad 324, and the lower face of the second semiconductor chip 320 opposite to the upper face.

In the present embodiment, the number of second chip selection through electrodes 420 is the same as the number of stacked semiconductor chips. In an alternative arrangement, the number of second chip selection through electrodes 420 may be more than the number of stacked semiconductor chips.

In FIG. 7, the second chip selection through electrodes 420 can be designated as a first through electrode 424 and second through electrodes 422, 426, 428. The first through electrode 424 and the second through electrodes 422, 426, 428 correspond to the second chip selection pad 324 and are disposed in the form of a 2×2 matrix.

The position of the first chip selection through electrodes 410 designated as the first through electrode 424 and the second through electrodes 422, 426, 428 is substantially equivalent to the position of the second chip selection through electrodes 420 designated as the first through electrode 424 and the second through electrodes 422, 426, 428 (i.e., the first chip selection through electrodes 410 are aligned with the second chip selection through electrodes 420).

In the present embodiment shown in FIG. 7, the first through electrode 424 of the second chip selection through electrodes 420 is disposed at the upper right portion of the second chip selection pad 324 (the first through electrode 424 may also be formed at other positions of the second chip selection pad 324, however, the first through electrode 424 of the second chip selection through electrodes 420 should not be disposed at the same position as the first through electrode 412 of the first chip selection through electrodes 410). The remaining second chip selection through electrodes 420 are the second through electrodes 422, 426, 428, and when the first through electrode 424 is formed at the upper right portion the second through electrodes 422, 426, 428 are disposed at the upper left, the lower left, and the lower right portions of the second chip selection pad 324.

The first through electrode 424 is electrically connected to the conductive layer of the second chip selection pad 324, and the second through electrodes 422, 426, 428 are electrically insulated from the conductive layer of the second chip selection pad 324.

In order to insulate the second through electrodes 422, 426, 428 from the conductive layer, openings corresponding to the second through electrodes 422, 426, 428 are formed in the conductive layer. However, other suitable methods of insulating the second through electrodes 422, 426, 428 exist, including disposing insulation layers in the portions corresponding to the second through electrodes 422, 426, 428.

Figure 8:
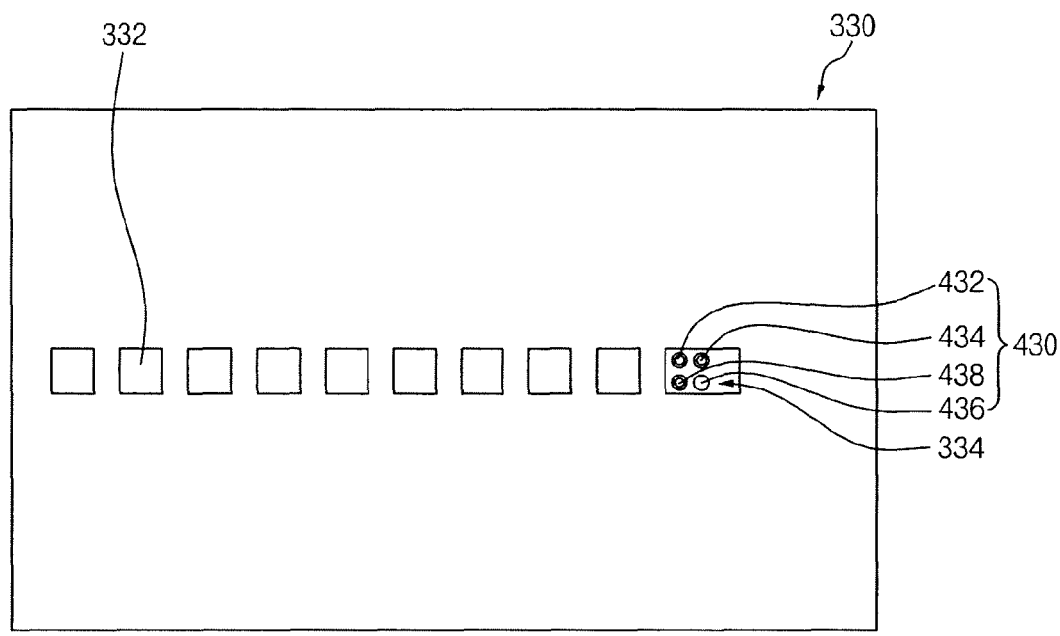

Referring to FIG. 8, the third semiconductor chip 330 is disposed below the second semiconductor chip 320 in the stacked semiconductor package 500.

The third semiconductor chip 330 includes a circuit unit (not shown), third data pads 332, and a third chip selection pad 334.

The third data pads 332 and the third chip selection pad 334 are each electrically connected to the circuit unit.

Figure 9:
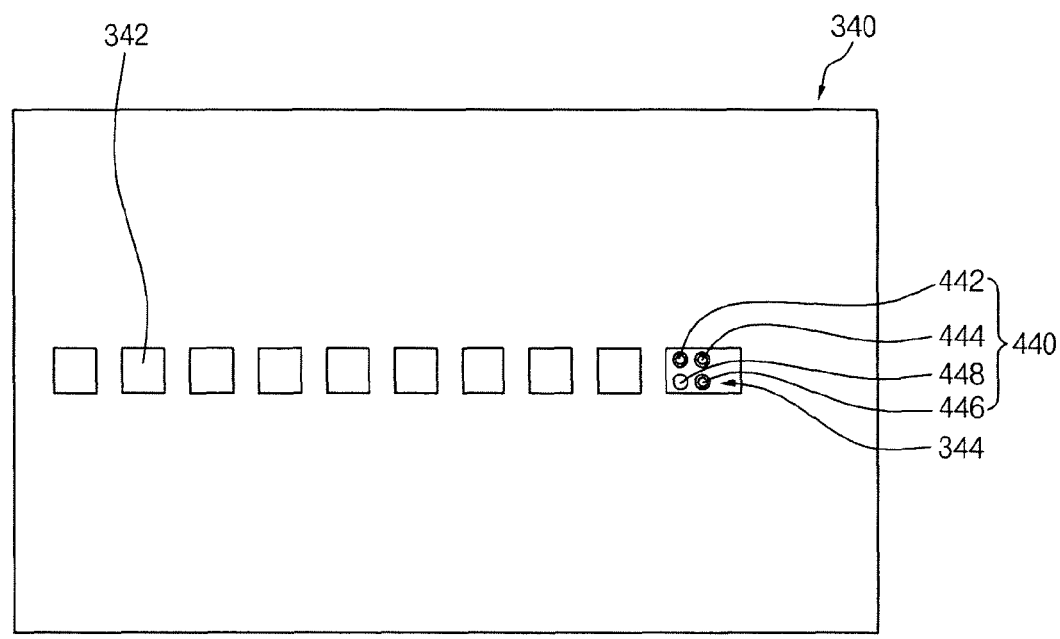

In the present embodiment shown in FIG. 9, the third chip selection pad 334 includes a third chip selection pad body (not shown, refer to FIG. 4) and a conductive layer formed over the third chip selection pad body. The conductive layer includes a metal such as aluminum or an aluminum alloy.

In one embodiment of the present invention, more than one third chip selection pad 334 may be disposed over an upper face of the third semiconductor chip 330. In the present embodiment, the position of the third chip selection pad 334 is substantially equivalent to (i.e., aligned with) the position of the second chip selection pad 324. In the embodiment of the present invention shown in FIG. 8, the size of the third chip selection pad 334 is greater than the size of the third data pad 332.

The third chip selection through electrodes 430 are disposed at a position corresponding to the third chip selection pad 334. The third chip selection through electrodes 430 penetrate the third chip selection pad 334, the upper face of the third semiconductor chip 330 corresponding to the third chip selection pad 334, and the lower face of the third semiconductor chip 330 opposite to the upper face.

In the present embodiment, the number of third chip selection through electrodes 430 is the same as the number of the stacked semiconductor chips. In an alternative arrangement, the number of third chip selection through electrodes 430 may be more than the number of stacked semiconductor chips.

In FIG. 8, the third chip selection through electrodes 430 can be designated as a first through electrode 436 and second through electrodes 432, 434, 438. The first through electrode 436 and the second through electrodes 432, 434, 438 correspond to the third chip selection pad 334 and are disposed in the form of a 2×2 matrix.

The position of the second chip selection through electrodes 420 designated as the first through electrode 424 and the second through electrodes 422, 426, 428 is substantially equivalent to the position of the third chip selection through electrodes 430 designated as the first through electrode 436 and the second through electrodes 432, 434, 438 (i.e., the second chip selection through electrodes 420 are aligned with the third chip selection through electrodes 430).

In the present embodiment shown in FIG. 8, the first through electrode 436 of the third chip selection through electrodes 430 is disposed at the lower right portion of the third chip selection pad 334 (the first through electrode 436 may also be formed at other positions of the third chip selection pad 334, however, the first through electrode 436 of the third chip selection through electrodes 430 should not be disposed at the same position as the first through electrode 412 of the first chip selection electrodes 410 or the first through electrode 424 of the second chip selection through electrodes 420). The remaining third chip selection through electrodes 430 are the second through electrodes 432, 434, 438, and when the first through electrode 436 is disposed at the lower right portion the second through electrodes 432, 434, 438 are disposed at the upper left, the upper right, and the lower left portions of the third chip selection pad 334.

The first through electrode 436 is electrically connected to the conductive layer of the third chip selection pad 334, and the second through electrodes 432, 434, 438 are electrically insulated from the conductive layer of the third chip selection pad 334. In order to insulate the second through electrodes 432, 434, 438 from the conductive layer, openings corresponding to the second through electrodes 432, 434, 438 are formed in the conductive layer. However, other suitable methods of insulating the second through electrodes 432, 434, 438 exist, including disposing insulation layers in the portions corresponding to the second through electrodes 432, 434, 438.

Referring to FIG. 9, the fourth semiconductor chip 340 is disposed below the third semiconductor chip 330 in the stacked semiconductor package 500.

The fourth semiconductor chip 340 includes a circuit unit (not shown), fourth data pads 342, and a fourth chip selection pad 344.

The fourth data pads 342 and the fourth chip selection pad 344 are each electrically connected to the circuit unit.

In the present embodiment shown in FIG. 9, the fourth chip selection pad 344 includes a fourth chip selection pad body (not shown, refer to FIG. 4) and a conductive layer formed over the fourth chip selection pad body. The conductive layer includes a metal such as aluminum or an aluminum alloy.

In an embodiment of the present invention, more than one fourth chip selection pad 344 may be disposed over an upper face of the fourth semiconductor chip 340. In the present embodiment, the position of the fourth chip selection pad 344 is substantially equivalent to (i.e., aligned with) the position of the third chip selection pad 334. In the embodiment of the present invention shown in FIG. 9, the size of the fourth chip selection pad 344 is greater than the size of the fourth data pad 342.

The fourth chip selection through electrodes 440 are disposed at a position corresponding to the fourth chip selection pad 344. The fourth chip selection through electrodes 440 penetrate the fourth chip selection pad 344, the upper face of the fourth semiconductor chip 340 corresponding to the fourth chip selection pad 344, and the lower face of the fourth semiconductor chip 340 opposite to the upper face.

In the present embodiment, the number of fourth chip selection through electrodes 440 is the same as the number of the stacked semiconductor chips. In an alternative configuration, the number of fourth chip selection through electrodes 440 may be more than the number of stacked semiconductor chips.

In FIG. 9, the fourth chip selection through electrodes 440 can be designated as a first through electrode 448 and second through electrodes 442, 444, 446. The first through electrode 448 and the second through electrodes 442, 444, 446 correspond to the fourth chip selection pad 344 and are disposed in the form of a 2×2 matrix.

The position of third chip selection through electrodes 430 designated as the first through electrode 436 and the second through electrodes 432, 434, 438 is substantially equivalent to the position of the fourth chip selection through electrodes 440 designated as the first through electrode 448 and the second through electrodes 442, 444, 446 (i.e., the third chip selection through electrodes 430 are aligned with the fourth chip selection through electrodes 440).

In the present embodiment shown in FIG. 9, the first through electrode 448 of the fourth chip selection through electrodes 440 is disposed at the lower left portion of the fourth chip selection pad 344 (the first through electrode 448 may also be formed at other positions of the fourth chip selection pad 344, however, the first through electrode 448 of the fourth chip selection through electrodes 440 should not be disposed at the same position as the first through electrode 412 of the first chip selection electrodes 410, the first through electrode 424 of the second chip selection through electrodes 420, or the first through electrode 436 of the third chip selection through electrodes 430). The remaining fourth chip selection through electrodes 440 are the second through electrodes 442, 444, 446, and when the first through electrode 448 is formed at the lower left portion the second through electrodes 442, 444, 446 are disposed at the upper left, the upper right, and the lower right portions of the third chip selection pad 334.

The first through electrode 448 is electrically connected to the conductive layer of the fourth chip selection pad 344, and the second through electrodes 442, 444, 446 are electrically insulated from the conductive layer of the fourth chip selection pad 344. In order to insulate the second through electrodes 442, 444, 446 from the conductive layer, openings corresponding to the second through electrodes 442, 444, 446 are formed in the conductive layer. However, other suitable methods of insulating the second through electrodes 432, 434, 438 exist, including disposing insulation layers in the portions corresponding to the second through electrodes 442, 444, 446.

Figure 10:
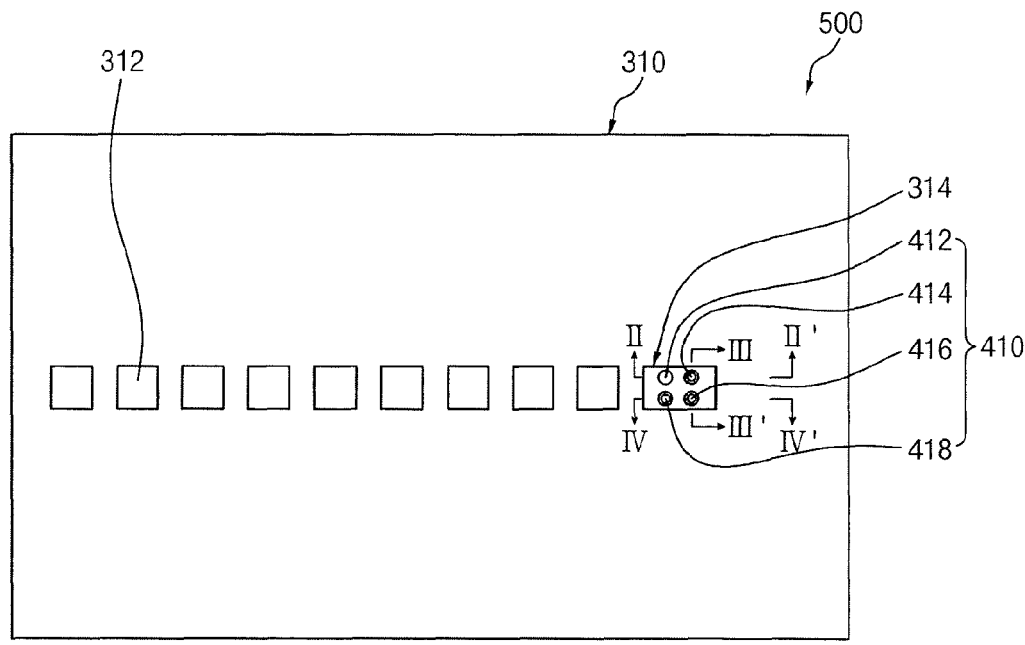
FIG. 10 is a plan view showing the stacked semiconductor package in which the semiconductor chips shown in FIGS. 6 through 9 are stacked.
Figure 11:
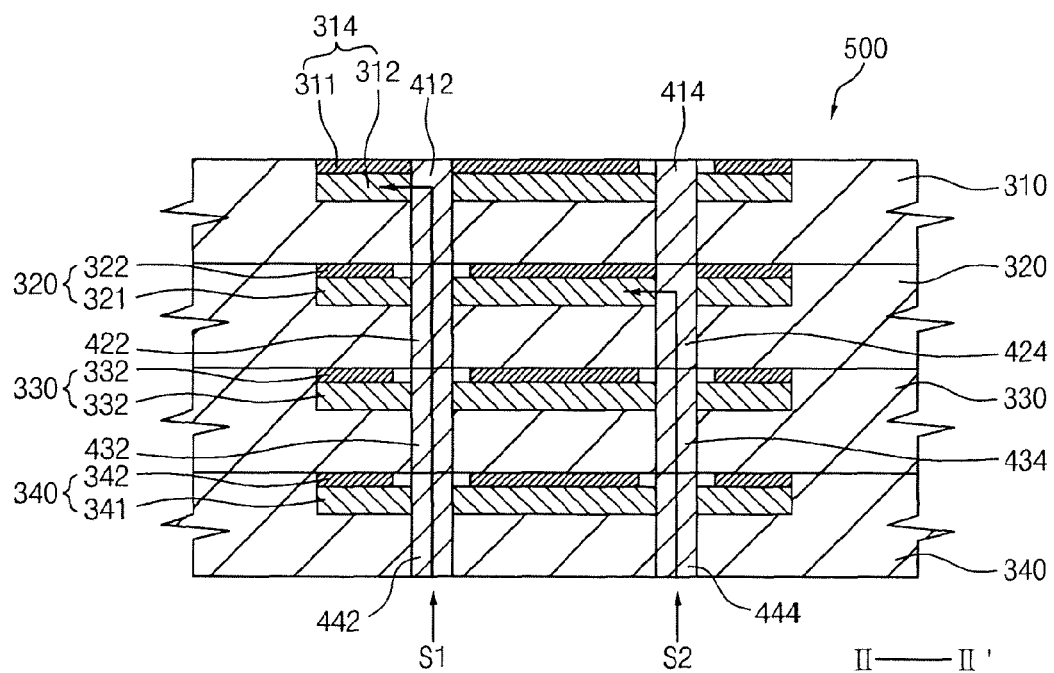
FIG. 11 is a cross-sectional view taken along line II-II' in FIG. 10.
Figure 12:
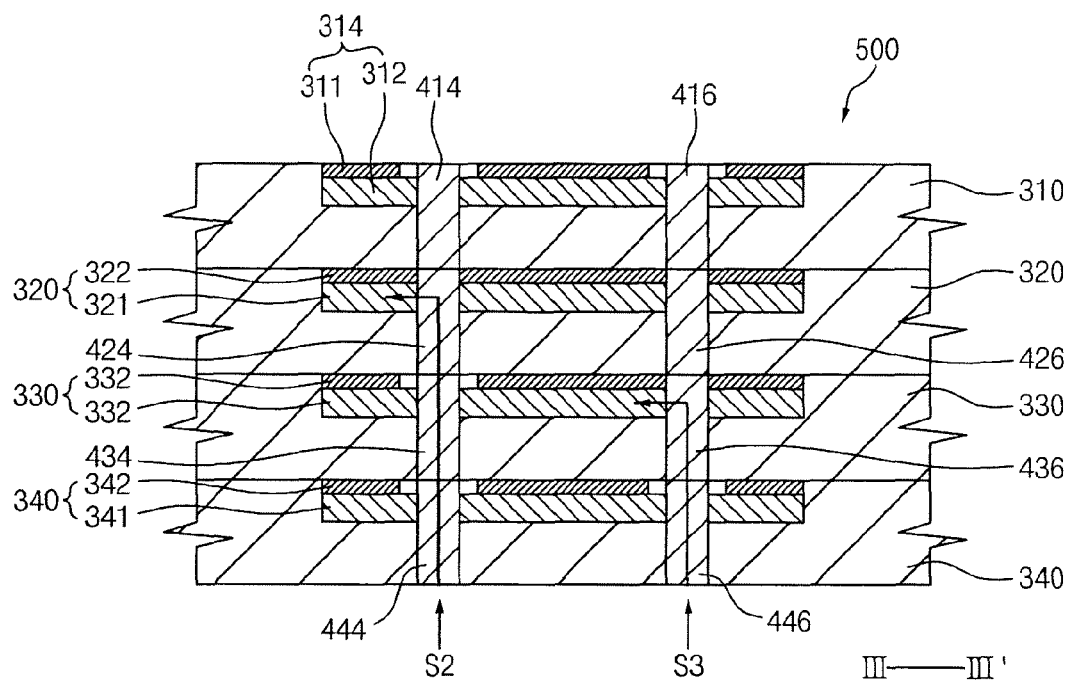
FIG. 12 is a cross-sectional view taken along line III-III' in FIG. 10.
Figure 13:
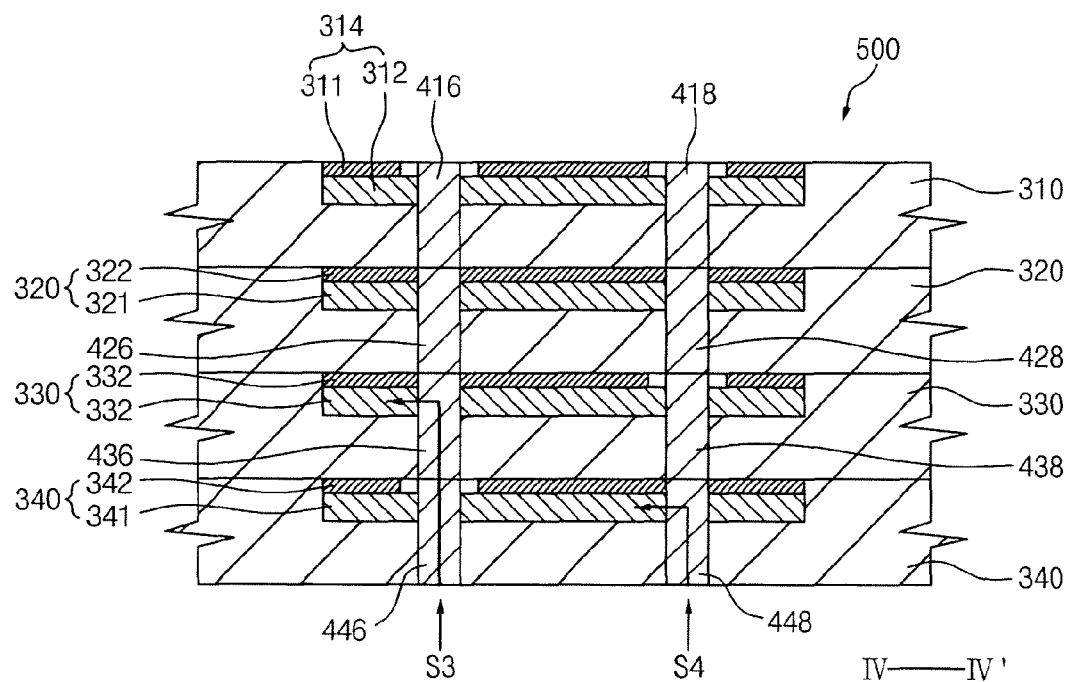
FIG. 13 is a cross-sectional view taken along line IV-IV' in FIG. 10.

FIG. 10 is a plan view showing the stacked semiconductor package in which the semiconductor chips shown in FIGS. 6 through 9 are stacked. FIG. 11 is a cross-sectional view taken along line II-II' in FIG. 10. FIG. 12 is a cross-sectional view taken along line III-III' in FIG. 10. FIG. 13 is a cross-sectional view taken along line IV-IV' in FIG. 10.

Referring to FIGS. 5 and 11, the first through electrode 412 of the first semiconductor chip 310 of the stacked semiconductor package 500 is electrically connected to the second through electrode 422 of the second semiconductor chip 320, the second through electrode 432 of the third semiconductor chip 330, and the second through electrode 442 of the fourth semiconductor chip 340. Therefore, when a first chip selection signal S1 is applied to the second through electrode 442 of the fourth semiconductor chip 340, the first semiconductor chip 310 is selected.

The first through electrode 424 of the second semiconductor chip 320 of the stacked semiconductor package 500 is electrically connected to the second through electrode 414 of the first semiconductor chip 310, the second through electrode 434 of the third semiconductor chip 330, and the second through electrode 444 of the fourth semiconductor chip 340. Therefore, when a second chip selection signal S2 is applied to the second through electrode 444 of the fourth semiconductor chip 340, the first semiconductor chip 320 is selected.

Referring to FIGS. 5 and 12, the first through electrode 436 of the third semiconductor chip 330 of the stacked semiconductor package 500 is electrically connected to the second through electrode 416 of the first semiconductor chip 310, the second through electrode 426 of the third semiconductor chip 330, and the second through electrode 446 of the fourth semiconductor chip 340. Therefore, when a third chip selection signal S3 is applied to the second through electrode 446 of the fourth semiconductor chip 340, the third semiconductor chip 330 is selected.

Referring to FIGS. 5 and 13, the first through electrode 448 of the fourth semiconductor chip 340 of the stacked semiconductor package 500 is electrically connected to the second through electrode 418 of the first semiconductor chip 310, the second through electrode 428 of the third semiconductor chip 330, and the second through electrode 438 of the third semiconductor chip 340. Therefore, when a fourth chip selection signal S4 is applied to the second through electrode 448 of the fourth semiconductor chip 340, the fourth semiconductor chip 340 is selected.

As is apparent from the above description, since it is possible to select a specific semiconductor chip among a plurality of semiconductor chips by forming chip selection pads at the same position of their respective semiconductor chip and changing the electrical connections of the through electrodes penetrating the chip selection pad and the chip selection pad so that they are electrically connected to specific semiconductor chips, it is possible to simplify the process of fabricating a stacked semiconductor package and shorten the time required for the fabrication.

In the present invention, a specific semiconductor chip among a plurality of semiconductor chips is selected using the conductive layer disposed over the chip selection pad and the chip selection through electrode, alternatively a specific semiconductor chip among a plurality of semiconductor chips may be selected by selectively removing an insulation layer formed between the chip selection through electrode and a through hole formed through the semiconductor chip.

That is, when the chip selection through electrode and the conductive layer are electrically connected to each other, the insulation layer is removed from the chip selection through electrode so that the chip selection through electrode is electrically connected to the conductive layer. On the country, when the chip selection through electrode and the conductive layer are electrically insulated to each other, the insulation layer is not removed from the chip selection through electrode so that the chip selection through electrode is insulated from the conductive layer.

Although specific embodiments of the present invention have been described for illustrative purposes, those skilled in the art will appreciate that various modifications, additions, and substitutions are possible without departing from the scope and the spirit of the invention as disclosed in the accompanying claims.

What is claimed is:

1. A semiconductor package, comprising:
    a semiconductor chip comprising a circuit unit, a data pad, and a chip selection pad, wherein the data pad and the chip selection pad are each electrically connected to the circuit unit; and
    at least two chip selection through electrodes for receiving signals, the chip selection through electrodes penetrating the chip selection pad and the semiconductor chip, wherein one through electrode is a first through electrode that is electrically connected to the chip selection pad of the semiconductor chip and the remaining through electrodes are one or more second through electrodes that are electrically insulated from the chip selection pad.

2. The semiconductor package according to claim 1, wherein the chip selection pad comprises a conductive layer, wherein the conductive layer is electrically connected to the first through electrode and comprises one or more openings for insulating the one or more second through electrodes.

3. The semiconductor package according to claim 1, wherein the first through electrode and the one or more second through electrodes are disposed in a matrix form.

4. The semiconductor package according to claim 1, wherein the number of the chip selection pads is at least two.

5. The semiconductor package according to claim 1, wherein the area of the chip selection pad is greater than the area of the data pad.

6. A stacked semiconductor package, comprising:
    a plurality of stacked semiconductor chips each semiconductor chip having a circuit unit, a data pad, and a chip selection pad; and
    a plurality of chip selection through electrodes penetrating the chip selection pads and the semiconductor chips having the chip selection pads, wherein the chip selection through electrodes receive chip selection signals,
    wherein the chip selection pad of a corresponding one of the semiconductor chips is electrically connected to the chip selection through electrode for receiving the chip selection signal for selecting the corresponding semiconductor chip, and is electrically insulated from the chip selection through electrodes for receiving the chip selection signal for selecting a different semiconductor chip.

7. The stacked semiconductor package according to claim 6, wherein each chip selection pad comprises a conductive layer and the chip selection through electrode for receiving the chip selection signal for selecting the corresponding semiconductor chip is electrically connected to the conductive layer.

8. The stacked semiconductor package according to claim 7, wherein the conductive layer of each chip selection pad of a corresponding one of the semiconductor chips comprises one or more openings for electrically insulating the chip selection pad from the chip selection through electrodes for receiving the chip selection signal for selecting a different semiconductor chip.

9. The stacked semiconductor package according to claim 7, wherein the conductive layer of each chip selection pad of a corresponding one of the semiconductor chips comprises an insulation member for electrically insulating the chip selection pad from the chip selection through electrodes for receiving the chip selection signal for selecting a different semiconductor chip.

10. The stacked semiconductor package according to claim 6, wherein the number of the chip selection pads of a semiconductor chip is at least two.

11. The stacked semiconductor package according to claim 6, wherein the chip selection through electrodes are disposed in a matrix form.

12. The stacked semiconductor package according to claim 6, wherein the chip selection through electrodes are disposed within through holes that penetrate the chip selection pads and the semiconductor chips having the chip selection pads.

13. The stacked semiconductor package according to claim 6, wherein the number of the chip selection through electrodes is equal to or greater than the number of the stacked semiconductor chips.

14. The stacked semiconductor package according to claim 6, wherein the area of the chip selection pad is greater than the area of the data pad.

15. A stacked semiconductor package, comprising:
a plurality of stacked semiconductor chips each semiconductor chip having a circuit unit, a data pad, and a chip selection pad; wherein each semiconductor chip comprises
one or more chip selection through electrodes penetrating the chip selection pad and the body of the semiconductor chip, wherein at least one of the chip selection through electrodes is a first through electrode that is electrically connected to the chip selection pad, and the remaining chip selection through electrodes are second through electrodes that are electrically insulated from the chip selection pad,
wherein the chip selection through electrodes of the stacked semiconductor chips are aligned with one another, such that the first through electrode of any one of the semiconductor chips is aligned with any one of the second through electrodes of each of the other semiconductor chips.

16. The stacked semiconductor package according to claim 15, wherein each chip selection pad comprises a conductive layer and the first through electrode that is electrically connected to the respective chip selection pad is electrically connected to the conductive layer.

17. The stacked semiconductor package according to claim 16, wherein the conductive layer of each chip selection pad comprises one or more openings for electrically insulating the chip selection pad from the second through electrodes.

18. The stacked semiconductor package according to claim 16, wherein the conductive layer of each chip selection pad comprises an insulation member for electrically insulating the chip selection pad from the second through electrodes.

19. The stacked semiconductor package according to claim 15, wherein the chip selection through electrodes of each semiconductor chip are disposed in a matrix form, and the matrix form of each semiconductor chip is substantially equivalent and aligned.

20. The stacked semiconductor package according to claim 15, wherein the number of the chip selection through electrodes is equal to or greater than the number of the stacked semiconductor chips.

\* \* \* \* \*